United States Patent

Lee

[15] 3,656,005

[45] Apr. 11, 1972

[54] TWO CIRCUIT SOLID STATE LIMIT SWITCH (1NO AND 1NC)

[72] Inventor: Art Lee, El Paso, Tex.

[73] Assignee: General Electric Company

[22] Filed: July 15, 1970

[21] Appl. No.: 55,052

[52] U.S. Cl. ..........................307/247 A, 200/47, 307/247 R, 307/252 B, 307/293, 335/154

[51] Int. Cl. ..................H03k 3/295, H03k 17/28, H01h 1/66

[58] Field of Search ..............307/247 A, 247, 252 B, 252 N, 307/252 P, 252 T, 284, 289, 290; 328/195, 196; 200/47; 335/151, 154

[56] References Cited

UNITED STATES PATENTS

| | | | |
|---|---|---|---|
| 3,218,477 | 11/1965 | Sharp | 328/196 X |
| 3,453,599 | 7/1969 | Lester | 307/252 B X |
| 3,259,854 | 7/1966 | Marcus et al. | 307/235 X |
| 3,308,340 | 3/1967 | Gille et al. | 307/252 T X |
| 3,403,314 | 9/1968 | Maynard | 307/252 B |
| 3,504,235 | 3/1970 | Lee | 200/47 X |
| 3,364,318 | 1/1968 | Bulliet | 200/47 |
| 3,252,345 | 5/1966 | Russell | 200/47 X |
| 3,458,679 | 7/1969 | Russell et al. | 200/168 G |
| 3,539,738 | 11/1970 | Bowen et al. | 200/47 X |
| 3,546,954 | 12/1970 | Ustin | 200/47 X |
| 3,175,077 | 3/1965 | Fox et al. | 307/252 T X |
| 3,388,265 | 6/1968 | Wright | 307/247 A X |

OTHER PUBLICATIONS

G. E. SCR Manual, 4th Edition, p. 85, 1967, General Electric Co.

Howell, " Triac Control for AC Power," Application Note, G. E. Publication (Semiconductor Products Dept.), p. 3, 200.35, 5/1964.

*Primary Examiner*—John S. Heyman
*Assistant Examiner*—L. N. Anagnos
*Attorney*—Arthur E. Fournier, Jr., David M. Schiller, Frank L. Neuhauser, Oscar B. Waddell and Joseph B. Forman

[57] ABSTRACT

A firing circuit, preferably for use in limit switches, consisting of two electrically isolated circuits which utilize solid state technology to provide the limit switch with the equivalent of a one normally open (1NO) and one normally closed (1NC) contact arrangement, the firing circuit consisting of a trigger arrangement comprising two transistors with common emitters and a connection made through a resistor between the collector of one transistor and the base of the other, a resistor and a capacitor being serially connected from the collector of each transistor to ground, the emitters from two unijunction transistors (UJT's) which form parts of two relaxation oscillators being connected to the intermediate point between the corresponding serially connected resistor and capacitor, the bases of the UJT's being connected to the primary windings of two pulse transformers thus providing two electrically isolated outputs for the firing of two isolated Triac circuits connected to the secondary windings of the pulse transformers, the trigger arrangement and the relaxation oscillators being connected across the output of a Zener regulated diode bridge rectifier to which an input voltage is applied, and an actuating switch being provided to control application of voltage to the base of one of the transistors to thereby control its conduction.

20 Claims, 3 Drawing Figures

Patented April 11, 1972 3,656,005

INVENTOR
ART LEE

BY Arthur E. Fournier Jr.

ATTORNEY

TWO CIRCUIT SOLID STATE LIMIT SWITCH (1NO AND 1NC)

BACKGROUND OF THE INVENTION

1. Field of the Invention

My invention relates to electrical switches, and more particularly to an improved firing circuit for electrical switches of the type known as limit switches which generally provide for switch operation when a device associated with the switch reaches a desired, or limiting, position.

2. Description of the Prior Art

In accordance with the teachings of the prior art, limit switches have long been employed for the purpose of controlling the motion of a machine or a piece of equipment as a function of position detection by altering an electrical circuit. By tripping the limit switch contacts, movable components can be started, stopped, raised, lowered, traversed, reversed, speeded up or slowed down. Limit switches can also be used to indicate position for sequencing operations or to provide interlocking. Thus, they can be used with nearly every type of electrical equipment where motion or position must be controlled.

A number of improvements have been made in the design of limit switches in recent years. One such improvement has involved providing a limit switch with an operating means which permits the limit switch to be used with devices having diverse motions. Prior to the occurrence of the latter development, the limit switches known to the prior art individually allowed only one type of device motion to be converted to the standard motion required for operation of the switch contacts. Another area in which attempts have been made to improve the design of limit switches involves rendering the latter immune to environmental conditions. Because limit switches are frequently employed in locations where they are subject to severe environmental conditions, such as dust, water, oil, and metal shavings, it is highly desirable that limit switches be designed such that their operating parts are effectively sealed against such environmental conditions so as to be capable of reliable and repetitive operations over long periods of service. In addition to the aforementioned improvements, there have now been designed limit switches which have increased power switching capabilities. The latter has been achieved primarily through the use of solid state circuit technology. One desirable feature which all of the above improvements have in common is that in general they have all been able to be incorporated within the limit switch housing without significantly increasing the physical dimensions thereof. Thus, this has permitted these limit switches to be readily accommodated without significant modification in the same applications in which limit switches have long been employed.

Notwithstanding all the work that has been done in an effort to provide new and better limit switches, as far as is known there has not heretofore existed a limit switch which employs solid state technology to provide the switch with two electrically isolated circuits. In many applications in which limit switches are utilized there exist a requirement that the limit switch be capable of controlling two separate loads. To this end, such a limit switch of necessity must be capable of providing two electrically isolated outputs. Additional requirements are that the solid state circuitry necessary to provide the aforesaid two electrically isolated outputs be such as to provide the equivalent of one normally open contact and one normally closed contact, that the circuitry be receivable within the standard size limit switch housing and that this circuitry as well as all operating parts of the limit switch be capable of being protected against environmental hazards.

OBJECTS OF THE INVENTION

It is therefore an object of the present invention to provide a novel and improved limit switch which employs solid state technology to provide the limit switch with two electrically isolated outputs.

It is another object of the present invention to provide such an electrically isolated two circuit limit switch wherein the two circuits function to provide the limit switch with the equivalent of a one normally open (1NO) and one normally closed (1NC) contact arrangement.

A further object of the present invention is to provide such an electrically isolated two circuit limit switch wherein complete electrical isolation has been achieved between the two outputs thereof as well as between the operating power and the outputs.

A still further object of the present invention is to provide such an electrically isolated two circuit limit switch wherein the controlled circuits are electrically non-overlapping such that both controlled circuits cannot be in the conducting state during the moments of switching from one state to another.

Yet another object of the present invention is to provide such an electrically isolated two circuit limit switch wherein the circuitry thereof is capable of being housed in a standard limit switch housing and wherein the operating parts of the limit switch are capable of being protected against environmental hazards.

SUMMARY OF THE INVENTION

In accordance with the preferred form of the invention there is provided a firing circuit for a limit switch consisting of two electrically isolated circuits which utilize solid state technology to provide the limit switch with the equivalent of a one normally open (1NO) and one normally closed (1NC) contact arrangement. The firing circuit consists basically of a trigger arrangement comprising two transistors with common emitters and a connection made through a resistor between the collector of one transistor and the base of the other. A resistor and capacitor are serially connected from the collector of each transistor to ground. The emitters of two unijunction transistors (UJT's) which form parts of two relaxation oscillators are connected to the intermediate point between the corresponding serially connected resistor and capacitor. The bases of the UJT's are connected to the primary windings of two pulse transformers thus providing two electrically isolated outputs for the firing of two isolated Triac circuits which are connected to the secondary windings of the pulse transformers. The trigger arrangement and the relaxation oscillators are connected across the output of a Zener regulated diode bridge rectifier to which an input voltage is applied. An actuating switch is provided to control application of voltage to the base of one of the transistors to thereby control its conduction. Initially, one transistor is conducting and its associated Triac is non-conducting and the other transistor is non-conducting and its associated Triac is conducting. When the actuating switch is closed, the turned-off transistor turns on whereby its collector voltage drops and since the collector of this transistor is connected to the base of the other transistor, the second transistor turns off. The voltage at the collector of the second transistor is accordingly increased causing a capacitor in the associated relaxation oscillator circuit to charge firing the corresponding UJT. Thus, the Triac that was conducting is turned off and the Triac that was turned off is now rendered conducting.

The invention will be more fully understood from the following detailed description and its scope will be pointed out in the appended claims.

DESCRIPTION OF A PREFERRED EMBODIMENT

Figure 1:
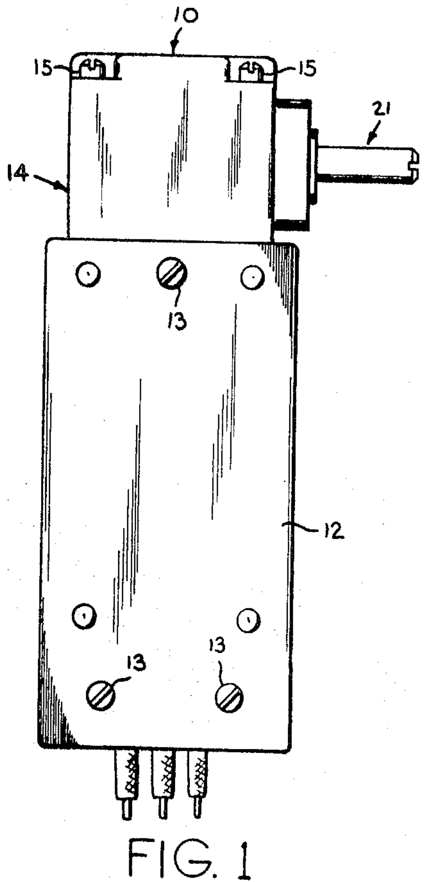
FIG. 1 is a side elevational view of a limit switch constructed in accordance with the present invention.
Figure 2:
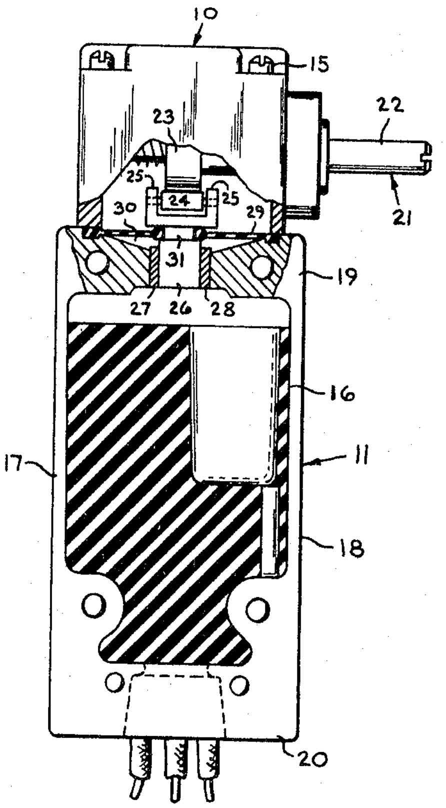
FIG. 2 is a view similar to FIG. 1 of a limit switch constructed in accordance with the present invention illustrated with the cover plate removed to show the potting compound employed to protect the limit switch against environmental hazards.

Referring now to the drawing there is illustrated in FIGS. 1 and 2 a so-called track type limit switch, generally designated by reference numeral 10, incorporating the invention and including a housing 11 and a cover 12 secured to the housing as by screws 13. The housing 11 may be formed of an aluminum casting and contains operating parts of the limit switch which are actuated by mechanism within an actuating head 14 secured to the exterior of the housing 11 at one end thereof by suitable means such as screws 15. In order to retain the operating parts the housing 11 includes a cavity 16 defined by the base of the housing, by a pair of spaced side walls 17 and 18, and by a pair of spaced end walls 19 and 20 connecting the side walls.

Although any suitable type of actuating head may be utilized for purposes of actuating the operating parts of the limit switch 10, in the illustrated embodiment the actuating head 14 is of the rotary type including a main shaft 21 journalled by space walls of the head 14 and having a part 22 projecting externally of the head 14 to which a suitable roller lever (not shown) may be attached to be engaged by a movable machine part or the like. The shaft 21 is urged to its normal position by suitable spring biased means (not shown) and carries a cam 23 cooperating with a cam follower in the form of a pin 24 secured between spaced arms 25 of a shaft 26 having a threaded recess which threadably receives a screw (not shown) having a protruding head which when the shaft 21 is in its normal position lightly touches a suitable lever means in a manner more fully set forth in U.S. Pat. No. 3,504,235, which is assigned to the same assignee as the present invention. The shaft 26 extends through a bushing 27 retained within an opening 28 of the end wall 19 which opens into a suitable compartment of a recessed portion of the end wall 19 which is bridged by an intermediate part of the aforementioned lever means. As shown in FIG. 2, a sealing ring 29 formed of rubber or like material is positioned within a recessed section 30 of the end wall 19 and includes a central opening which surrounds a restricted portion 31 of the shaft 26. The ring 29 is firmly held between the end wall 19 and the actuating head 14.

In operation, rotation of the shaft 21 in response to engagement of a machine tool part or the like with a lever (not shown) fixed to the part 22 of the shaft 21 results in rotation of the cam 23 which is suitably shaped to engage the pin 24 and depress it together with the shaft 26 and screw (not shown) downwardly as viewed with reference to FIG. 2 of the drawing. This results in deflection of the aforesaid lever means to cause actuation of the switch means of the limit switch 10 in the manner described in more detail in the aforementioned U.S. Pat. No. 3,504,235. As described in the latter patent, the switch means of the limit switch 10 may comprise a normally open reed switch wherein the contacts thereof are caused to close as a result of the downward deflection of the aforedescribed lever means. When the shaft 21 is released by withdrawal of the movable machine part, it returns to its normal position whereby the pin 24, shaft 26, and lever means are also caused to return to their normal position by suitable means as described in U.S. Pat. No. 3,504,235 with the result that the contacts of the reed switch move to their normally open condition. Inasmuch as the mechanical operation of the limit switch 10 is only indirectly related to the particular subject matter of the present invention, the above description of the manner in which rotation of the shaft 21 through engagement with a suitable machine tool part or the like is transmitted to the switch operating lever means is deemed to be sufficient to provide one skilled in the art with a full understanding of the present invention. In addition, as noted previously, U.S. Pat. No. 3,504,235 provides a complete explanation of the structure and mechanical operation of the form of track type limit switch illustrated in FIGS. 1 and 2 of the drawing.

Figure 3:
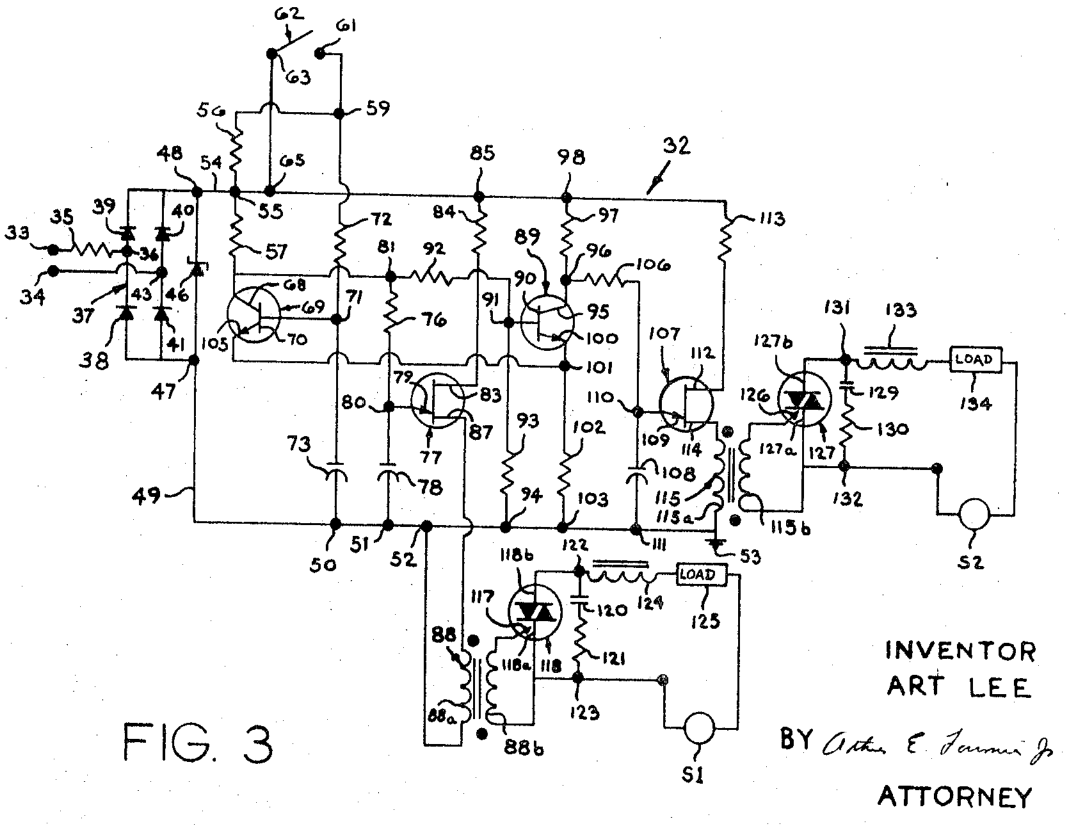
FIG. 3 is a schematic diagram of the firing circuit for the limit switch of FIG. 1 consisting of two electrically isolated circuits which utilize solid state technology to provide the limit switch with the equivalent of a one normally open (1NO) and one normally closed (1NC) contact arrangement.

In order to provide a limit switch with two electrically isolated outputs, the switch means of the limit switch 10 is connected to the electrical firing circuit, generally designated by reference numeral 32, illustrated in FIG. 3 of the drawing. In the preferred embodiment of the invention, the firing circuit 32 consists of two electrically isolated circuits which utilize solid state technology to provide the limit switch 10 with the equivalent of a one normally open (1NO) and one normally closed (1NC) contact arrangement. More specifically, the invention provides a trigger circuit under control of the switch means of the limit switch for controlling operation of two oscillators such that the oscillators have opposite output conditions at any given time. A pair of transformers have their primary windings connected for energization in accord with the outputs of the oscillators whereby their secondary windings provide two electrically isolated outputs which have opposite conditions at any given time.

Referring now to the circuit diagram of FIG. 3, operating power for the firing circuit 32 is applied across terminals 33 and 34. This power may be an alternating current source having a voltage of from 18 volts RMS to 240 volts RMS. Terminal 33 is connected through series resistor 35 to one input terminal 36 of a full wave bridge rectifier 37 comprising diodes 38, 39, 40, and 41. Series resistor 35 is suitably selected to provide the proper operating current. Terminal 34 is connected to the other input terminal 43 of full wave bridge rectifier 37. Zener diode 46 is connected across the output terminals 47 and 48 of the full wave bridge rectifier 37 in order to clamp the output voltage of the rectifier 37. Since no filter capacitor is used, the output voltage of the rectified power supply is in a trapezoidal form at twice the frequency of the alternating current source.

Output terminal 47 of the full wave bridge rectifier 37 is connected through lead 49 to terminals 50, 51, and 52 and to ground 53. The other output terminal 48 of full wave bridge rectifier 37 is connected through lead 54 to the junction 55 between resistors 56 and 57, and terminals 65, 85 and 98. Resistor 56 is connected between junction 55 and terminal 59, the latter terminal in turn being connected to contact 61 of normally open switch 62. The other contact 63 of switch 62 is connected to terminal 65. Switch 62 preferably comprises a magnetic reed switch operable in response to actuation of the actuating head in the manner briefly described hereinabove, a more complete description of this operation being set forth in U.S. Pat. No. 3,504,235.

Resistor 57 is connected between junction 55 and the collector 68 of transistor 69 which has its base 70 connected to the junction 71 between resistor 72 and capacitor 73. Resistor 72 is connected between terminal 59 and junction 71 while capacitor 73 is connected between junction 71 and terminal 50. Associated with the collector 68 of transistor 69 is an additional circuit including resistor 76, unijunction transistor 77, and capacitor 78. As seen from FIG. 3, emitter electrode 79 of unijunction transistor 77 is connected to the junction 80 between resistor 76 and capacitor 78 with the resistor 76 and capacitor 78 being connected in series between terminal 81 and terminal 51, terminal 81 being connected to the collector 68 of transistor 69. A first base electrode 83 of unijunction transistor 77 is connected through resistor 84 to terminal 85 which is connected to terminal 65. The second base electrode 87 of unijunction transistor 77 is connected to one end of the primary winding 88*a* of pulse transformer 88 and the other end of winding 88*a* is connected to terminal 52.

Referring further to FIG. 3 of the drawing, firing circuit 32 includes a second transistor 89 which has its base 90 connected to the junction 91 between resistors 92 and 93. Resistor 92 is connected between junction 91 and terminal 81 whereas resistor 93 is connected between junction 91 and terminal 94. The collector 95 of transistor 89 is connected to terminal 96 and therethrough to one end of resistor 97 which has its other end connected to terminal 98 which is connected to terminal 85. The emitter 100 of transistor 89 is connected to terminal 101 and therethrough to one end of resistor 102 which has its other end connected to terminal 103. In addition, the emitter 100 of transistor 89 is connected through terminal 101 to the emitter 105 of previously described transistor 69. Associated with the collector 95 of transistor 89 is an additional circuit including resistor 106, unijunction transistor 107, and capacitor 108. The emitter electrode 109 of unijunction transistor 107 is connected to the junction 110 between resistor 106 and capacitor 108 with the resistor 106 and capacitor 108 being connected in series between terminal 96 and terminal 111. A first base electrode 112 of unijunction transistor 107 is connected through resistor 113 to terminal 98. The second base electrode 114 of unijunction transistor 107 is connected to one end of the primary winding 115*a* of pulse transformer 115 and the other end of winding 115*a* is connected to ground 53.

Turning now to a description of the manner of operation of the portion of the firing circuit 32 thus far described, it is seen that as previously described operating power preferably from a suitable alternating current source is applied across input terminals 33 and 34. Resistor 35 is selected to provide the proper operating current and the voltage output of the full wave bridge rectifier 37 is clamped by the Zener diode 46. The pulsating direct current voltage output of the full wave bridge rectifier 37 is impressed across transistor 69 and 89 through current limiting resistors 57 and 97, respectively. With switch 62 open, the base 70 of transistor 69 has a very small positive bias voltage applied thereto through resistor 56. This small bias voltage is not sufficient to allow the transistor 69 to turn on, therefore, a voltage appears at the collector 68 of transistor 69.

The collector voltage of transistor 69 is divided by the action of resistors 92 and 93 so that a portion of it is applied to the base 90 of transistor 89 causing the transistor 89 to conduct. When transistor 89 is in a conductive state, the collector voltage thereof is reduced by resistor 102 in the emitter circuit of the transistor 89. Since the emitters 105 and 100 of transistors 69 and 89, respectively, are tied together, the small positive voltage appearing at the emitter 100 of transistor 89 is also applied to the emitter 105 of transistor 69 causing a positive level which will inhibit any conduction of transistor 69 until adequate base drive is applied to its base 70.

When switch 62 is closed, the resistor 56 is thereby shunted so that the base 70 of transistor 69 has applied thereto a greater bias voltage which is more positive than the voltage at emitter 105 and conduction of transistor 69 takes place. When transistor 69 starts to conduct, the voltage at its collector 68 is reduced and the voltage out of the divider at the base 90 of transistor 89 is similarly reduced. The emitter voltage of transistor 69 now rises and is also applied to the emitter 100 of transistor 89 causing a partial turn off of the transistor 89. The rise in emitter voltage of transistor 89 coupled with the drop in its base drive will cause transistor 89 to stop conducting. When transistor 89 is in a non-conductive state a voltage will appear at its collector 95. Conversely, when transistor 69 is conducting, a very low voltage will appear at its collector 68.

The above comprises a description of the trigger or flip flop portion of the firing circuit 32. However, as seen with reference to FIG. 3 of the drawing, associated with each collector 68 and 95, respectively, of transistor 69 and 89 is an additional circuit consisting of a unijunction transistor, a capacitor, a pulse transformer primary winding, and two resistors. In the case of the collector 68 of transistor 69 this additional circuit consists of unijunction transistor 77, capacitor 78, the primary winding 88a of pulse transformer 88, and resistors 76 and 84. For collector 95 of transistor 89, the aforesaid additional circuit consists of unijunction transistor 107, capacitor 108, the primary winding 115*a* of pulse transformer 115, and resistors 106 and 113.

Continuing with the description of the manner of operation of the firing circuit 32, the voltage appearing at the collector of either transistor 69 or transistor 89 when that particular transistor is in a non-conducting state is coupled through a resistor to a timing circuit consisting of a capacitor and a unijunction transistor. Assuming for purposes of description that the transistor 69 is in a non-conducting state, the voltage appearing at the collector 68 thereof is coupled through resistor 76 to a timing circuit consisting of capacitor 78, resistor 76, and unijunction transistor 77. Similarly, when transistor 89 is in a non-conducting state the voltage appearing at the collector 95 thereof is coupled through resistor 106 to a timing circuit consisting of capacitor 108, resistor 106, and unijunction transistor 107. Such collector voltage charges the corresponding capacitor, i.e., capacitor 78 or capacitor 108 depending on whether transistor 69 or transistor 89 is in a non-conducting state until the capacitor voltage reaches the peak point of the associated unijunction transistor, i.e., unijunction transistor 77 or unijunction transistor 107 at which time the unijunction transistor conducts, discharging the capacitor through the emitter and second base electrode and the associated pulse transformer primary winding to ground. The capacitor is then recharged by the voltage through the associated resistor and the process is repeated as long as a charging voltage is available. The frequency of this operation is determined by the value of the particular capacitor and the supply resistor. In accordance with the preferred embodiment of the invention, a frequency of from approximately 1 to 3 KHZ is employed.

Thus, it can be seen that the unijunction transistor associated with the non-conducting transistor will be in oscillation and will be delivering a train of pulses at its pulse transformer output. Further, it will be noted that when the transistor is in a conducting state, no pulses are produced from the associated unijunction transistor.

Referring again to FIG. 3 of the drawing, the secondary winding 88*b* of pulse transformer 88 is connected between the gate terminal 117 and one main terminal 118*a* of Triac 118. A capacitor 120 and a resistor 121 connected in series between terminals 122 and 123 form a protective network across the main terminals 118*a* and 118*b* of Triac 118. The function of the protective network consisting of capacitor 120 and resistor 121 is to prevent the rate of voltage rise per unit of time from falsely triggering the Triac into conduction. This is commonly referred to as *dv/dt* protection. An inductor 124 is connected in series with the main terminals 118*a* and 118*b* of the Triac 118 to reduce the radiated electrical noise generated by the switching action of the Triac 118. A suitable load 125 is illustrated in the drawing as being connected in series with the inductor 124 and a suitable source S1 of alternating voltage is connected to supply current to the load 125 when the Triac 118 is conducting. The load 125 and source S1 are of course located externally of the housing 11.

In a fashion similar to that described hereinabove in connection with the secondary winding 88*b* of pulse transformer 88, the pulse transformer 115 has its secondary winding 115*b* connected between the gate terminal 126 and one main terminal 127*a* of Triac 127. A capacitor 129 and resistor 130 connected in series between terminals 131 and 132 form a protective network across the main terminals 127*a* and 127*b* of Triac 127 whereby to prevent the rate of voltage rise per unit of time from falsely triggering the Triac 127 into conduction. An inductor 133 is preferably connected in series with the main terminals 127*a* and 127*b* of the Triac 127 to reduce the radiated electrical noise generated by the switch action of the Triac 127. Load 134 and alternating voltage source S2 are connected in series with the main terminals 127*a* and 127*b* of Triac 127 such that the load 134 is energized from source S2 when the Triac 127 is conducting. The load 134 and source S2 are located externally of the housing 11.

Based on the preceding description, it is clearly seen that the electrical firing circuit 32 illustrated in FIG. 3 of the drawing functions to provide the limit switch 10 with two electrically isolated outputs. The latter two outputs give the limit switch 10 the equivalent of a one normally open (1NO) and one normally closed (1NC) contact arrangement. This is accomplished through the use of solid state technology whereby the firing circuit 32 consists of two electrically isolated circuits. In accordance with the preferred embodiment of the invention, a trigger circuit consisting of a pair of transistors 69 and 89 is provided whereby when one of the pair of transistors is in a non-conducting state the other is in a conducting state and vice versa. Preferably the closing of the contacts of a normally open magnetic reed switch 62 is employed to change the state of conduction of the transistors 69 and 89. Associated with these two transistors are two unijunction transistors 77 and 107 and their electrical components. In the manner previously described more fully hereinabove the unijunction transistor associated with the non-conducting transistor will be in oscillation and will be delivering a train of pulses at its pulse transformer output whereas no pulses are produced from the unijunction transistor associated with the other transistor which is in a conducting state. The Triac associated with the unijunction transistor which is producing a train of pulses is in a conducting state whereby the load associated therewith is energized. Conversely, the Triac which is associated with the unijunction transistor which is not producing a train of pulses is in a non-conducting state and the load associated therewith is in deenergized condition. Depending on whether the switch 62 is in an open or a closed condition one or the other of the loads associated with the two Triacs will be in an energized condition and the other will be in a deenergized condition. In response to a change in the condition of the switch 62, i.e., from normally open to closed condition or vice versa, the load which was in an energized condition now becomes deenergized while the load which was deenergized becomes energized.

The electrical firing circuit 32 described hereinabove and illustrated in FIG. 3 of the drawing possesses a number of unique features. Thus, one achievement has been the development of a flip flop circuit with power outputs available from both transistors without the need of a buffer or decoupling stage. A second feature is that a distinct switching operation has been accomplished that prevents both oscillators from being on at the same time. If both were on, the two outputs would be on leading to a shorted condition in some applications. Finally, complete electrical isolation has been achieved between the two outputs as well as between the operating power and the outputs.

Thus, in accordance with the present invention there has been provided a novel and improved limit switch which employs solid state technology to provide the limit switch with two electrically isolated outputs. Further, the two circuits of the subject electrically isolated two circuit limit switch function to provide the limit switch with the equivalent of a one normally open (1NO) and one normally closed (1NC) contact arrangement. Moreover, electrical isolation has been achieved between the two circuit outputs as well as between the operating power and the outputs. In addition, an electrically isolated two circuit limit switch has been provided wherein the circuitry thereof is capable of being housed within a standard limit switch housing and wherein the operating parts of the limit switch are capable of being protected against environmental hazards.

While only one embodiment of my invention has been shown, it will be appreciated that many modifications thereof may readily be made by those skilled in the art. For example, although switch 62 has been described as being in the nature of a normally open magnetic reed switch, it is to be understood that other switch means capable of changing the base drive of transistor 69 may be substituted therefor. To exemplify this, one modification may take the form of a Hall effect, or other magnetic flux sensitive transducer and an integrated circuit transistor amplifier that would be installed in place of the reed switch 62 to detect the change in magnetic flux due to the change of position of the circularly polarized ring magnet as disclosed in U.S. Pat. No. 3,504,235. In accordance with the preferred embodiment of the invention, the firing circuit 32 has been illustrated and described as using NPN-transistors 69 and 89. However, it is to be understood that if so desired PNP-transistors would equally well be employed in the firing circuit 32 in place of the NPN-transistors 69 and 89. Another possible modification involves the replacement of the two unijunction transistors 77 and 107 by silicon unilateral switches. Inasmuch as the characteristics of the silicon unilateral switch are such that temperature compensation is not required, the resistors 84 and 113 may also be eliminated from the circuit if silicon unilateral switches are substituted for the unijunction transistors. I therefore intend by the appended claims to cover the above modifications as well as all other modifications which fall within the spirit and scope of my invention.

What I claim as new and desire to secure by Letters Patent of the United States is:

1. A firing circuit for providing a switch with the equivalent of a one normally open (1NO) and one normally closed (1NC) contact arrangement comprising:

a. a pair of input terminals for connection to a voltage source;

b. a trigger circuit connected in circuit with said input terminals to be supplied with operating voltage, said trigger circuit including first and second solid state electronic devices each having two main electrodes and a control electrode for controlling conduction between said main electrodes;

c. said first solid state electronic device having a conducting condition and a non-conducting condition, and said second solid state electronic device having a conducting condition and a non-conducting condition;

d. circuit means interconnecting certain of said electrodes of said first and second solid state electronic devices such that when said first solid state electronic device is in said conducting condition said second solid state electronic device is in said non-conducting condition and when said first solid state electronic device is in said non-conducting condition said second solid state electronic device is in said conducting condition;

e. first and second oscillators each connected in circuit with a separate one of said first and second solid state electronic devices for operation in response to voltages appearing at corresponding ones of said main electrodes to produce oscillation outputs only when the associated device is in said non-conducting condition, whereby said oscillators have opposite output conditions at any given time;

f. first and second transformers each having a primary winding and a secondary winding, each of said primary windings being connected in circuit with a separate one of said oscillators for energization in accord with the output of the associated oscillator whereby said secondary windings have opposite output conditions at any given time;

g. said secondary winding of said first transformer being connected to a first load and said secondary winding of said second transformer being connected to a second load, said secondary winding outputs being electrically isolated from said voltage source and from each other thereby also electrically isolating said first load and said second load from said voltage source and from each other; and h. an actuating switch connected in circuit with the control electrode of said first solid state electronic device, said actuating switch being actuatable between an open condition wherein a first voltage is established at said associated control electrode of said first solid state electronic device, said first voltage condition established when said actuating switch is in said open condition comprising a small voltage causing said first solid state electronic device to assume said non-conducting condition and said second solid state electronic device to assume said conducting condition, and a closed condition wherein a second different voltage condition is established at said associated control electrode of said first solid state electronic device, said second voltage condition established when said actuating switch is in said closed condition comprising a larger voltage causing said first solid state electronic device to assume said conducting condition and said second solid state electronic device to assume a non-conducting condition.

2. A circuit as defined in claim 1 wherein said first and second devices comprise NPN-transistors each having emitter, collector and base electrodes, the emitter electrodes of said devices being connected together and the collector electrode of said first device being connected to the base electrode of said second device.

3. A circuit as defined in claim 1 wherein the frequency of the oscillation outputs of said oscillators is approximately within the range of from 1 to 3 KHZ.

4. A circuit as defined in claim 1 wherein each of said oscillators comprises a unijunction transistor having an emitter electrode and a pair of base electrodes, and a series connection of a resistor and a capacitor connected for energization in accord with voltage of one of the main electrodes of the associated device, the emitter electrode of each unijunction transistor being connected to a point between the associated resistor and capacitor whereby voltage of each capacitor is applied to the emitter of the associated unijunction transistor.

5. A circuit as defined in claim 1 further including a pair of Triacs each having a gate and two main terminals, each of said secondary windings being connected between the gate and one of the main terminals of a separate one of said Triacs.

6. A limit switch comprising:

a. a housing defining a cavity;

b. a switch within said cavity actuatable between open and closed conditions;

c. actuating means mounted on the exterior of said housing for effecting actuation of said switch; and d. a firing circuit within said cavity controlled by said switch for providing the equivalent of a one normally open (1NO) and one normally closed (1NC) contact arrangement, said firing circuit comprising:

I. a pair of input terminals for connection to a voltage source;

II. a trigger circuit connected in circuit with said input terminals to be supplied with operating voltage, said trigger circuit including first and second solid state electronic devices each having two main electrodes and a control electrode for controlling conduction between said main electrodes;

III. said first solid state electronic device having a conducting condition and a non-conducting condition, and said second solid state electronic device having a conducting condition and a non-conducting condition;

IV. first circuit means interconnecting certain of said electrodes of said first and second solid state electronic devices such that when said first solid state electronic device is in said conducting condition said second solid state electronic device is in said non-conducting condition and when said first solid state electronic device is in said non-conducting condition said second solid state electronic device is in said conducting condition;

V. first and second oscillators each connected in circuit with a separate one of said first and second solid state electronic devices for operation in response to voltages appearing at corresponding ones of said main electrodes to produce oscillation outputs only when the associated device is in said non-conducting condition, whereby said oscillators have opposite output conditions at any given time;

VI. first and second transformers each having a primary winding and a secondary winding, each of said primary windings being connected in circuit with a separate one of said oscillators for energization in accord with the output of the associated oscillator whereby said secondary windings have opposite output conditions at any given time;

VII. said secondary winding of said first transformer being connected to a first load and said secondary winding of said second transformer being connected to a second load, said secondary winding outputs being electrically isolated from said voltage source and from each other thereby also electrically isolating said first load and said second load from said voltage source and from each other; and VIII. second circuit means including said switch for controlling application of voltage to the control electrode of said first solid state electronic device, said switch being actuatable between said open condition wherein a first voltage is established at said associated control electrode of said first solid state electronic device, said first voltage condition established when said switch is in said open condition comprising a small voltage causing said first solid state electronic device to assume said non-conducting condition and said second solid state electronic device to assume said conducting condition, and said closed condition wherein a second different voltage condition is established at said associated control electrode of said first solid state electronic device, said second voltage condition established when said switch is in said closed condition comprising a larger voltage causing said first solid state electronic device to assume said conducting condition and said second solid state electronic device to assume a non-conducting condition.

7. A limit switch as defined in claim 6 wherein said first and second devices comprise NPN-transistors each having emitter, collector and base electrodes, the emitter electrodes of said devices being connected together and the collector electrode of said first device being connected to the base electrode of said second device.

8. A limit switch as defined in claim 6 wherein the frequency of the oscillation outputs of said oscillators is approximately within the range of from 1 to 3 KHZ.

9. A limit switch as defined in claim 6 wherein each of said oscillators comprises a unijunction transistor having an emitter electrode and a pair of base electrodes, and a series connection of a resistor and a capacitor connected for energization in accord with voltage of one of the main electrodes of the associated device, the emitter electrode of each unijunction transistor being connected to a point between the associated resistor and capacitor whereby voltage of each capacitor is applied to the emitter of the associated unijunction transistor.

10. A limit switch as defined in claim 6 further including a pair of Triacs each having a gate and two main terminals, each of said secondary windings being connected between the gate and one of the main terminals of a separate one of said Triacs.

11. A firing circuit for providing a switch with the equivalent of a one normally open (1NO) and one normally closed (1NC) contact arrangement comprising:

a. a pair of input terminals for connection to a voltage source;

b. a first solid state electronic device having an emitter, a collector, and a base;

c. said first device being connected in circuit with said pair of input terminals to be supplied with operating voltage;

d. a second solid state electronic device having an emitter, a collector, and a base;

e. said second device being connected in circuit with said pair of input terminals to be supplied with operating voltage;

f. said emitter of said first device being connected to said emitter of said second device and said collector of said first device being connected to said base of said second device;

g. a first resistor and a first capacitor connected in series with said first resistor connected to said collector of said first device whereby said first capacitor is charged in accord with voltage at the collector of said first device when the latter is non-conducting;

h. a second resistor and a second capacitor connected in series with said second resistor connected to said collector of said second device whereby said second capacitor is charged in accord with voltage at the collector of said second device when the latter is non-conducting;

i. a third solid state electronic device having an emitter and first and second bases, said third device being rendered conductive between its emitter and first base when a first predetermined voltage is applied to its emitter, said emitter of said third device being connected to a point intermediate said first resistor and first capacitor whereby said first capacitor when charged applies a voltage to the emitter of said third device and discharges through the emitter and said first base of said third device when said first capacitor is charged to said first predetermined voltage;

j. a fourth solid state electronic device having an emitter and first and second bases, said fourth device being rendered conductive between its emitter and said first base when a second predetermined voltage is applied to its emitter, said emitter of said fourth device being connected to a point intermediate said second resistor and second capacitor whereby said second capacitor when charged applies a voltage to the emitter of said fourth device and discharges through the emitter and said first base of said fourth device when said second capacitor is charged to said second predetermined voltage;

k. a first pulse transformer having a primary winding and a secondary winding, said primary winding of said first pulse transformer being connected to said first base of said third device for energization in response to discharge of said first capacitor, and said secondary winding of said first pulse transformer when energized providing said firing circuit with a first electrically isolated output;

l. a second pulse transformer having a primary winding and a secondary winding, said primary winding of said second pulse transformer being connected to said first base of said fourth device for energization in response to discharge of said second capacitor, and said secondary winding of said second pulse transformer when energized providing said firing circuit with a second electrically isolated output;

m. an actuating switch connected in circuit between said pair of input terminals and said first device to control application of voltage to the base of said first device; and n. said actuating switch being actuatable between an open contact condition and a closed contact condition, said actuating switch when in said open contact condition establishing a first voltage condition at the base of said first device to render one of said first and second devices conducting and the other of said first and second devices non-conducting so that an output is produced at one of said first and second electrically isolated outputs, and said actuating switch when in said closed contact condition establishing a second different voltage condition at the base of said first device to render said one of said first and second devices non-conducting and said other of said first and second device conducting so that an output is produced at the other of said first and second electrically isolated outputs.

12. A firing circuit as defined in claim 11 wherein:

a. said first and second devices each comprises a transistor; and b. said third and fourth device each comprises a unijunction transistor.

13. A firing circuit as defined in claim 11 further including:

a. a fifth solid state electronic device having a gate and first and second main terminals; and b. said secondary winding of said first pulse transformer being connected between said gate and one of said main terminals of said fifth device wherein said first electrically isolated output is produced only when said fifth device is in conducting condition.

14. A firing circuit as defined in claim 13 further including:

a. a third resistor and third capacitor connected in series between said first and second main terminals of said fifth device; and b. said fifth device comprising a Triac.

15. A firing circuit as defined in claim 14 further including:

a. a sixth solid state electronic device having a gate and first and second main terminals; and b. said secondary winding of said pulse transformer being connected between said gate and one of said main terminals of said sixth device wherein said second electrically isolated output is produced only when said sixth device is in conducting condition.

16. A firing circuit as defined in claim 19 further including:

a. a fourth resistor and fourth capacitor connected in series between said first and second main terminals of said sixth device; and b. said sixth device comprising a Triac.

17. A firing circuit as defined in claim 19 further including:

a. a full wave bridge rectifier having a first pair of terminals and a second pair of terminals;

b. said first pair of terminals of said rectifier being connected to said pair of input terminals;

c. a Zener diode connected to said second pair of terminals of said rectifier;

d. said first device being connected in circuit with said pair of input terminals through said Zener diode; and e. said actuating switch comprising a magnetic reed switch.

18. In a limit switch actuating means mounted in an actuating head and switch actuating means mounted in a housing, said switch actuating means being responsive to operation of said actuating mechanism, the improvement of a firing circuit for providing said limit switch with the equivalent of one normally open (1NO) and one normally closed (1NC) contact arrangement comprising:

a. a pair of input terminals for connection to a voltage source;

b. a first transistor having an emitter, a collector, and a base;

c. said first transistor being connected in circuit with said pair of input terminals to be supplied with operating voltage;

d. a second transistor having an emitter, a collector, and a base;

e. said second transistor being connected in circuit with said pair of input terminals to be supplied with operating voltage;

f. said emitter of said first transistor being connected to said emitter of said second transistor and said collector of said first transistor being connected to said base of said second transistor;

g. a first resistor and a first capacitor connected in series with said first resistor connected to said collector of said first device whereby said first capacitor is charged in accord with voltage at the collector of said first transistor when the latter is non-conducting;

h. a second resistor and a second capacitor connected in series with said second resistor connected to said collector of said second transistor whereby said second capacitor is charged in accord with voltage at the collector of said second transistor when the latter is non-conducting;

i. a first unijunction transistor having an emitter and first and second bases, said first unijunction transistor being rendered conductive between its emitter and first base when a first predetermined voltage is applied to its emitter, said emitter of said first unijunction transistor being connected to a point intermediate said first resistor and first capacitor whereby said first capacitor when charged applies a voltage to the emitter of said first unijunction transistor and discharges through the emitter end said first base of said first unijunction transistor when said first capacitor is charged to said first predetermined voltage;

j. a second unijunction transistor having an emitter and first and second bases, said second unijunction transistor being rendered conductive between its emitter and said first base when a second predetermined voltage is applied to its emitter, said emitter of said second unijunction transistor being connected to a point intermediate said second resistor and second capacitor whereby said second capacitor when charged applies a voltage to the emitter of said second unijunction transistor and discharges through the emitter and said first base of said second unijunction transistor when said second capacitor is charged to said second predetermined voltage;

k. a first pulse transformer having a primary winding and a secondary winding, said primary winding of said first pulse transformer being connected to said first base of said first unijunction transistor for energization in response to discharge of said first capacitor, and said secondary winding of said first pulse transformer when energized providing said firing circuit with a first electrically isolated output;

l. a second pulse transformer having a primary winding and a secondary winding, said primary winding of said second pulse transformer being connected to said first base of said second unijunction transistor for energization in response to discharge of said second capacitor, and said secondary winding of said second pulse transformer when energized providing said firing circuit with a second electrically isolated output;

m. an actuating switch connected in circuit between said pair of input terminals and said first transistor to control application of voltage to the base of said first transistor; and n. said actuating switch being actuatable by said switch actuating means mounted in said housing between an open contact condition and a closed contact condition, said actuating switch when in said open contact condition establishing a first voltage condition at the base of said first transistor to render one of said first and second transistors conducting and the other of said first and second transistors non-conducting so that an output is produced at one of said first and second electrically isolated outputs, and said actuating switch when in said closed contact condition establishing a second different voltage condition at the base of said first transistor to render said one of said first and second transistors non-conducting and said other of said first and second transistors conducting so that an output is produced at the other of said first and second electrically isolated outputs.

19. In a limit switch as defined in claim 18 further including:

a. a first solid state electronic device having a gate and a pair of main terminals; and b. said secondary winding of said first pulse transformer being connected between said gate and one of said pair of main terminals of said first device wherein said first electrically isolated output is produced only when said first device is in conducting condition.

20. In a limit switch as defined in claim 19 further including:

a. a second solid state electronic device having a gate and a pair of main terminals; and b. said secondary winding of said second pulse transformer being connected between said gate and one of said pair of main terminals of said second device wherein said second electrically isolated output is produced only when said second device is in conducting condition.

* * * * *

PO-1050
(5/69)

UNITED STATES PATENT OFFICE
CERTIFICATE OF CORRECTION

Patent No. 3,656,005 Dated April 11, 1972

Inventor(s) Art Lee

It is certified that error appears in the above-identified patent and that said Letters Patent are hereby corrected as shown below:

Inventor's address is El Paso, Illinois not El Paso, Texas

Claim 18, line 1, "means" should be - mechanism -

Claim 18, line 42, "end" should be - and -

Signed and sealed this 28th day of November 1972.

(SEAL)
Attest:

EDWARD M.FLETCHER,JR.
Attesting Officer

ROBERT GOTTSCHALK
Commissioner of Patents